(12) United States Patent
Pham et al.

(10) Patent No.: US 12,742,833 B1
(45) Date of Patent: Sep. 22, 2026

(54) SYSTEM AND METHOD FOR DIAGNOSING VEHICLE POWER DISTRIBUTION USING BATTERY-TERMINAL AND ECU-REPORTED VOLTAGE CORRELATION

(71) Applicant: Innova Electronics Corporation, Irvine, CA (US)

(72) Inventors: Phuong Pham, Fountain Valley, CA (US); Keith Andreasen, Garden Grove, CA (US); Thuan Cong Huynh, Ho Chi Minh City (VN); Ninh Tan Do, Ho Chi Minh City (VN); Tuan Quoc Le, Ho Chi Minh City (VN)

(73) Assignee: Innova Electronics Corporation, Irvine, CA (US)

( * ) Notice: Subject to any disclaimer, the term of this patent is extended or adjusted under 35 U.S.C. 154(b) by 0 days.

(21) Appl. No.: 19/570,903

(22) Filed: Mar. 18, 2026

(51) Int. Cl.
*G01R 31/396* (2019.01)
*G01R 1/067* (2006.01)
(Continued)

(52) U.S. Cl.
CPC ....... *G01R 31/396* (2019.01); *G01R 1/06788* (2013.01); *G01R 13/029* (2013.01);
(Continued)

(58) Field of Classification Search
CPC ......................... G01R 31/396; G01R 1/06788; G01R 13/029; G01R 19/0053; G01R 19/2513;
(Continued)

(56) References Cited

U.S. PATENT DOCUMENTS 7,039,534 B1 5/2006 Ryno
9,761,066 B2 9/2017 Chen
(Continued)

FOREIGN PATENT DOCUMENTS

JP 2003243044 A * 8/2003
WO 2012049559 A2 4/2012

OTHER PUBLICATIONS

English machine translation of JP2003243044A (Year: 2003).*

*Primary Examiner* — Walter L Lindsay, Jr.
*Assistant Examiner* — Geoffrey T Evans
(74) *Attorney, Agent, or Firm* — Stetina Garred Brucker & Newboles

(57) ABSTRACT

A system and method are disclosed for diagnosing vehicle electrical power distribution conditions includes digital computing device that receives diagnostic data from an on-board diagnostic interface device, the diagnostic data including at least one control-module-reported supply voltage parameter. The computing device also receives battery-terminal voltage measurements from a voltage measurement device coupled directly to terminals of a vehicle battery, the battery-terminal voltage measurements being independent of vehicle electronic control units. The digital computing device correlates the control-module-reported supply voltage parameter with the battery-terminal voltage measurements over time to determine whether a voltage anomaly originates at the battery or along a downstream power distribution path supplying one or more electronic control units. In example embodiments, the system buffers voltage data, distinguishes transient fluctuations from sustained deviations, optionally applies adaptive alignment techniques, compares voltage behavior across multiple control modules, and generates diagnostic outputs including visual
(Continued)

wiring representations identifying suspected power distribution elements.

23 Claims, 8 Drawing Sheets

(51) Int. Cl.

| | |
|---|---|
| ***G01R 13/02*** | (2006.01) |
| ***G01R 19/00*** | (2006.01) |
| ***G01R 19/25*** | (2006.01) |
| ***G01R 31/00*** | (2006.01) |
| ***G01R 31/371*** | (2019.01) |
| ***G01R 31/3835*** | (2019.01) |
| ***G01R 31/52*** | (2020.01) |

(52) U.S. Cl.
CPC ..... *G01R 19/0053* (2013.01); *G01R 19/2513* (2013.01); *G01R 19/2516* (2013.01); *G01R 31/007* (2013.01); *G01R 31/371* (2019.01); *G01R 31/3835* (2019.01); *G01R 31/52* (2020.01)

(58) Field of Classification Search
CPC ......................... G01R 19/2516; G01R 31/007; G01R 31/371; G01R 31/3835; G01R 31/52
See application file for complete search history.

(56) References Cited

U.S. PATENT DOCUMENTS

| | | | |
|---|---|---|---|
| 2007/0182248 | A1 | 8/2007 | Blaker |
| 2009/0027056 | A1 | 1/2009 | Huang |
| 2011/0082621 | A1 | 4/2011 | Berkobin |
| 2013/0127611 | A1 | 5/2013 | Bernstein |
| 2014/0107976 | A1 | 4/2014 | Kallfelz |
| 2014/0358367 | A1 | 12/2014 | Copeland |
| 2016/0303977 | A1 | 10/2016 | Kudo |
| 2019/0304213 | A1 | 10/2019 | Chen |
| 2019/0385386 | A1 | 12/2019 | Davidson |
| 2020/0342694 | A1 | 10/2020 | Pham |
| 2021/0018569 | A1 | 1/2021 | Carlo |
| 2021/0276450 | A1 | 9/2021 | Eshleman |
| 2022/0169264 | A1 | 6/2022 | Du |
| 2024/0351471 | A1 | 10/2024 | Andreasen |
| 2025/0284582 | A1 | 9/2025 | Andreasen |

* cited by examiner

ECU Voltages (Live Data for All Systems)

| Control Module) | Measured Voltage (V) |
|---|---|
| Engine Control Module (ECM) | xx Volts |
| Transmission Control Module (TCM) | xx Volts |
| Anti-lock Brake System (ABS) | xx Volts |
| Supplemental Restraint System (SRS) | xx Volts |
| Body Control Module (BCM) | xx Volts |
| Instrument Panel Cluster (IPC) | xx Volts |

400
404
Diagnostic Report Summary
Vehicle: 2019 Toyota Camry 2.0L
Vin: XXXX123456789
Garage: XXXXXXXXXXXX
408
Detected Issue
System: Engine Control (ECM)
Fault Code: P0562 - System Voltage Low
Status: Active Fault
Severity Medium
412
Live Data Value

| Parameter | Value | Normal Range |
| --- | --- | --- |
| Battery Voltage | 11.2V | ● 12.4V - 14.7V |
| Alternator Output | 12.0V | ● 13.5V - 14.5V |
| Ignition Voltage | 11.3V | ● - 12.0V |

416
424
Wiring Diagram View
Highlighted Area: ECM Power Line
Status: No voltage detected
Action: Check fuse F12, connector C104, and ground G108
*Tap to View Full Diagram*
420
Recommended Fix
Inspect and replace blown fuse (F12)
Clean/repair ground point (G108)
Check for broken or corroded wire between battery and ECM 400'
Fuse Panel
GND
Check Fuse
F12
+ −
Battery
(Vbatt Normal)
GND3
432
Check
Connector
C104
ECU
(ECM)
G108
ECU Supply
(0 Volts)
428

FIG. 4

Example ECU-Reported Voltage Parameters

| ***Voltage Parameter*** | ***Example PID / Source*** | ***Result Returned*** | ***Meaning / Interpretation*** |
|---|---|---|---|
| Control Module Voltage | PID $42 (standard OBD-II) | Single voltage value (e.g., 12.2 V) | Represents the supply voltage observed internally by a reporting ECU or aggregated control module; reflects voltage after upstream wiring, fuses, and connectors. |
| Engine Control Module Supply Voltage | OEM-specific PID (ECM) | Module-specific voltage value | Indicates voltage available at the engine control module input; useful for identifying drops affecting engine-related systems. |
| Transmission Control Module Supply Voltage | OEM-specific PID (TCM) | Module-specific voltage value | Indicates voltage at the transmission control module; comparison with other ECUs can reveal shared or isolated power feed issues. |
| Body Control Module Supply Voltage | OEM-specific PID (BCM) | Module-specific voltage value | Reflects voltage supplied to body-related electronics; helps distinguish cabin-side distribution issues from engine-bay issues. |
| ABS / Brake Control Module Voltage | OEM-specific PID (ABS/ESC) | Module-specific voltage value | Indicates voltage available to safety-related control modules; deviations may indicate critical power or ground integrity issues. |
| Network-Aggregated Module Voltage | OEM-specific gateway-reported PID | Aggregated or representative voltage value | Provides a composite view of module supply voltage on a vehicle network; useful when per-module PIDs are unavailable. |

FIG. 5

Example Manufacturer-Specific ECU Voltage Parameters

| ***Manufacturer/ Platform*** | ***Voltage Parameters Commonly Exposed*** | ***Diagnostic Access Method*** | ***Typical Meaning of Reported Voltage*** | ***Relevance*** |
|---|---|---|---|---|
| GM (General Motors) | ECM, BCM, TCM, ABS module supply voltage | Manufacturer-specific enhanced diagnostics; UDS DIDs on newer platforms | Internal or input supply voltage observed at the ECU | Enables identification of downstream voltage drops affecting shared or individual power feeds |
| Ford | PCM, BCM, ABS module supply voltage | Enhanced diagnostics; UDS DIDs or Ford-specific parameters | Voltage at module power input or internal supply | Supports detection of ground splice, connector, or power distribution faults |
| Stellantis (Chrysler / Jeep / RAM) | TIPM, BCM, PCM supply voltage | Manufacturer-specific diagnostic parameters | Voltage supplied to modules via centralized power distribution elements | Useful for isolating faults within integrated power distribution modules |
| Toyota / Lexus | Battery (BATT) voltage, ignition (IG) voltage, ECU supply voltage | Enhanced Toyota diagnostic parameters | Differentiates constant battery feed from ignition-switched feed | Allows separation of ignition-path issues from battery-path issues |
| VW Group (VW / Audi / Porsche) | Terminal 30 (battery), Terminal 15 (ignition), internal ECU supply voltage | UDS ReadDataByIdentifier (Service $22) | Voltage at standardized power terminals or internal ECU supply | Provides granular voltage context for comparative, multi-ECU analysis |
| BMW | ECU supply voltage, wake-up voltage, network-related voltage states | Proprietary diagnostic layer over UDS | Voltage present during different vehicle power states | Supports time-based correlation of voltage behavior across operating states |
| Mercedes-Benz | ECU supply voltage and power-state-dependent voltage values | Proprietary diagnostics over UDS | Voltage observed during wake, run, and sleep states | Enables differentiation between transient and sustained voltage anomalies |

FIG. 6

Example ECU Voltage Data

| *ECU Identifier* | *ECU Function* | *Reported Voltage (LIVV)* | *Battery Voltage (Vbatt)* | *Voltage Status* |
|---|---|---|---|---|
| ECU A | Engine Control | 12.2 V | 13.6 V | Low |
| ECU B | Transmission Control | 12.1 V | 13.6 V | Low |
| ECU C | Body Control | 13.6 V | 13.6 V | Normal |

FIG. 7

Operating State and Expected Voltage Behavior

| *Operating State* | *Typical Battery Voltage* | *Expected ECU Voltage Behavior* |
|---|---|---|
| Engine Off | ~12.6 V | Minor variation acceptable |
| Engine Cranking | 9-11 V (transient) | Temporary drops expected |
| Engine Running | 13.5-14.5 V | ECU voltages should track battery |
| High Electrical Load | Variable | Short transient drops acceptable |

FIG. 8

Example Voltage Pattern Interpretation

| *Battery Voltage Condition* | *ECU Voltage Pattern* | *Likely Interpretation* |
|---|---|---|
| Stable | Multiple ECUs low | Shared power feed issue |
| Low | All ECUs low | Battery or charging system issue |
| Stable | Single ECU low | Local wiring or ground fault |
| Fluctuatin g | Irreular ECU readings | Intermittent connection |

FIG. 9

Data Sources Used by the System

| ***Data Type Source*** | ***Device*** | ***Location*** |
|---|---|---|
| Battery Voltage | Voltmeter | Battery terminals |
| ECU Voltage (LIVV) | OBD-II Dongle | ECU internal reportin g |
| Diagnostic Trouble Codes | OBD-II Dongle | ECU memory |
| Operating State Parameters | OBD-II Dongle | ECU parameters |
| Correlation Results | Cloud Server Remote | Intermittent processing |

FIG. 10

Example Cloud Server Functions

| ***Function*** | ***Performed By*** |
|---|---|
| Data aggregation | Smartphone and/or cloud server |
| Time alignment | Smartphone and/or cloud server |
| Voltage correlation | Cloud server |
| Fault inference | Cloud server |
| Report generation | Cloud server |

FIG. 11

Persistence and Evaluation Logic

| ***Observed Condition*** | ***Evaluation Approach*** |
|---|---|
| Transient voltage dip | Logged but not flagged |
| Sustained voltage mismatch | Flagged as fault candidate |
| Repeating intermittent drops | Diagnostic confidence increased |

FIG. 12

SYSTEM AND METHOD FOR DIAGNOSING VEHICLE POWER DISTRIBUTION USING BATTERY-TERMINAL AND ECU-REPORTED VOLTAGE CORRELATION

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to systems and methods for diagnosing vehicle electrical and power-supply conditions. The disclosure is more particularly directed to systems and methods that correlate battery-terminal voltage measurements with control-module-reported voltage data to identify and localize vehicle power distribution, power feed, and ground-path anomalies.

2. Description of the Related Art

Automotive diagnostics and repair methods have evolved significantly over the past century, transitioning from purely mechanical troubleshooting techniques to highly sophisticated digital systems. In the earliest days of automobile maintenance, vehicle diagnostics relied entirely on manual inspections, with mechanics and car owners using simple observation methods to detect issues. Common practices included listening for abnormal engine sounds, checking the color of exhaust smoke, and performing visual inspections of belts, hoses, and spark plugs. In the absence of standardized diagnostic tools, identifying vehicle problems was a highly skilled trade, requiring extensive hands-on experience. Mechanics would use compression testing to evaluate engine health, vacuum gauges to assess fuel and air mixture performance, and distributor timing adjustments to optimize engine efficiency. However, these techniques were time-consuming and often inconclusive, making vehicle repairs both costly and unpredictable.

As automotive technology advanced in the mid-20th century, manufacturers began integrating electronic control systems to enhance vehicle performance and emissions regulation. This shift was largely influenced by government regulations, particularly the Clean Air Act of 1970, which imposed stricter emission control requirements on vehicle manufacturers. To comply with these regulations, automakers introduced early forms of onboard diagnostics, now known as OBD-I, in the late 1970s and early 1980s. These proprietary systems were designed to monitor engine performance and emissions but were highly inconsistent across different manufacturers. Each brand developed its own diagnostic protocols and connector types, making it difficult for mechanics to work on multiple vehicle brands without specialized tools. Additionally, OBD-I systems had limited storage capacity for fault codes, meaning that issues could only be detected and not always easily diagnosed. Despite these shortcomings, OBD-I represented a major step forward in vehicle diagnostics, providing the first electronic self-monitoring capabilities that helped identify problems such as misfires, oxygen sensor failures, and fuel mixture irregularities.

By the early 1990s, the lack of standardization in OBD-I systems became a growing challenge, especially as vehicles incorporated more complex electronic fuel injection and engine management systems. In response, regulatory agencies such as the California Air Resources Board (CARB) and the U.S. Environmental Protection Agency (EPA) mandated the implementation of a universal diagnostic standard known as OBD-II. Fully adopted in 1996, OBD-II revolutionized vehicle diagnostics by introducing a standardized set of diagnostic trouble codes (DTCs) that applied to all manufacturers. This allowed mechanics and vehicle owners to use a single diagnostic tool across multiple car brands, eliminating the need for proprietary manufacturer-specific equipment. The OBD-II standard also introduced a universal 16-pin diagnostic port, enabling easy access to vehicle data without requiring direct interaction with the engine control module. In addition to fault code retrieval, OBD-II systems provided real-time data monitoring capabilities, allowing users to access critical performance metrics such as engine temperature, fuel mixture, battery voltage, and oxygen sensor readings. Another major advancement was the system's ability to continuously monitor emissions, ensuring that vehicles met environmental regulations throughout their lifespan.

Modern vehicles incorporate standardized on-board diagnostics that enables monitoring, diagnosis, and reporting of vehicle operating conditions and faults. The OBD-II framework defines both a physical diagnostic interface and a logical communication structure through which vehicle electronic systems can be accessed by external diagnostic equipment. This architecture is now ubiquitous across passenger vehicles and light trucks and serves as a foundational element of contemporary vehicle diagnostics.

In example embodiments, diagnostic evidence is acquired from a vehicle via an OBD interface. As used herein, an "on-board diagnostics interface" refers broadly to any hardware and/or software mechanism through which diagnostic information from one or more ECUs can be accessed, requested, received, or monitored. The on-board diagnostics interface is not limited to any specific physical connector, communication protocol, or access architecture.

In certain example embodiments, the on-board diagnostics interface comprises a physical vehicle diagnostic port, such as a diagnostic link connector (DLC), accessible within the vehicle cabin or other vehicle-accessible location. In such embodiments, a diagnostic tool, interface device, or diagnostic dongle is physically coupled to the diagnostic port. Communication between the diagnostic tool and one or more ECUs may occur over standardized or proprietary vehicle communication protocols, including but not limited to CAN, ISO 9141, ISO 14230 (KWP2000), ISO 15765, J1850, DoIP (Diagnostics over Internet Protocol), or other transport mechanisms supported by the vehicle. Diagnostic requests may include service mode requests, parameter identification (PID) queries, diagnostic trouble code (DTC) retrieval commands, freeze-frame data retrieval, monitor status requests, or other standardized or manufacturer-specific diagnostic services.

In other example embodiments, the on-board diagnostics interface comprises a wireless or intermediary interface device that is physically connected to the vehicle diagnostic port but communicates wirelessly with a host computing device. For example, a diagnostic dongle may couple to the DLC and communicate with a smartphone, tablet, or other computing device via Bluetooth, Wi-Fi, cellular, or other wireless communication technologies. In such embodiments, the host computing device may issue diagnostic commands that are transmitted through the wireless interface device to the vehicle ECUs, and diagnostic responses may be received through the same pathway. The on-board diagnostics interface in such embodiments encompasses both the physical port coupling and the wireless communication path used to relay diagnostic information.

In further example embodiments, diagnostic information is acquired through a vehicle onboard telematics system. In such embodiments, a telematics control unit (TCU) or similar vehicle-integrated communication module provides access to diagnostic data without requiring a physical diagnostic link connector connection by the diagnostic tool. The telematics system may communicate with vehicle ECUs over internal vehicle networks and expose diagnostic information through a wireless interface, such as a cellular data connection, Wi-Fi connection, satellite link, or other remote communication mechanism. Diagnostic evidence may be requested through authenticated service interfaces, application programming interfaces (APIs), or other authorized access mechanisms provided by the vehicle manufacturer or fleet management infrastructure.

In certain example embodiments, the on-board diagnostics interface may include or interact with an intermediate gateway module or network management controller within the vehicle. Modern vehicles often include gateway ECUs that regulate access to internal vehicle networks for security and safety reasons. In such embodiments, acquisition of diagnostic evidence may involve authentication, session negotiation, secure unlocking procedures, or other access control mechanisms prior to retrieving diagnostic data. The on-board diagnostics interface, as used herein, includes such gateway-mediated access paths.

In additional example embodiments, OBD information may be acquired passively rather than through explicit polling. For example, diagnostic evidence may include monitored bus traffic, broadcast diagnostic messages, event notifications, or spontaneous fault reports transmitted by vehicle ECUs. In such embodiments, the on-board diagnostics interface may capture and record diagnostic information without issuing individual query commands for each data element.

In some example embodiments, acquisition of OBD information may occur through a remote computing environment that interfaces with the vehicle through telematics infrastructure or fleet management systems. For example, a cloud-based backend may issue diagnostic requests to a vehicle through a telematics service provider, receive diagnostic responses, and process such responses to generate canonical diagnostic evidence packets as described herein. In such embodiments, the on-board diagnostics interface function is logically implemented through a remote communication path rather than a locally attached device.

The on-board diagnostics interface may support synchronous or asynchronous communication, request-response interactions, streaming data acquisition, buffered data retrieval, or combinations thereof. Diagnostic evidence may include raw response frames, interpreted parameter values, diagnostic trouble codes, monitor completion states, calibration identifiers, vehicle identification information, or other data made available through the vehicle's diagnostic capabilities.

Accordingly, the term "on-board diagnostics interface" is intended to encompass physical, wireless, telematic, gateway-mediated, and remote access mechanisms by which diagnostic information from vehicle ECUs can be acquired. Example embodiments are not limited to any particular physical connection type, communication protocol, or system architecture, and the diagnostic evidence acquisition techniques described herein may be implemented in any configuration capable of accessing vehicle diagnostic data.

The logical structure of OBD-II centers on a collection of electronic control units distributed throughout the vehicle. ECUs are embedded computing modules responsible for controlling and monitoring specific vehicle subsystems. Common examples include an engine control module, transmission control module, anti-lock braking system module, body control module, airbag or restraint control module, and various modules associated with climate control, steering, and driver assistance features. Each ECU typically includes one or more microprocessors, memory, sensor inputs, actuator outputs, and internal power regulation circuitry that allows it to operate from the vehicle's electrical system.

Within the OBD-II framework, ECUs communicate diagnostic and operational data using standardized parameter identifiers (PIDs) and DTCs. PIDs represent measurable or computed values, such as engine speed, coolant temperature, or system voltage, while DTCs indicate detected fault conditions associated with sensors, actuators, or system behavior. Some ECUs also report internal supply or system voltage values, reflecting the voltage level available to that module during operation. These reported values provide insight into how each ECU perceives the vehicle's electrical environment.

Vehicle ECUs are typically interconnected via one or more in-vehicle networks, most commonly a controller area network (CAN) bus. Through these networks, ECUs exchange control messages, sensor data, and status information in real time. Power and ground are distributed to the ECUs through the vehicle's electrical system, often via shared power feeds, fuses, relays, and grounding points. As a result, multiple ECUs may depend on common power or ground paths, even though they perform distinct functions and reside in different physical locations. OBD-II data is provided by data communication with various ECUs found in typical vehicles. Vehicles can include one or more ECUs responsible for engine control, transmission control, braking, occupant restraint, body functions, and driver information display, with the presence, separation, and integration of such control units varying by vehicle architecture.

An engine control module (ECM) is responsible for controlling and monitoring engine operation. The ECM manages functions such as fuel injection, ignition timing, air-fuel ratio, emissions control, and engine protection strategies. It receives input from numerous sensors and controls various actuators to maintain efficient and compliant engine operation. Because the ECM is critical to vehicle operation, it is typically powered through dedicated battery and ignition feeds and continuously monitors its own supply voltage.

A transmission control module (TCM) controls operation of the vehicle's transmission. The TCM manages gear selection, shift timing, torque converter operation, and adaptive shifting behavior based on vehicle speed, engine load, and driver input. In some vehicles, the TCM is a separate module, while in others it is integrated with the ECM. Like other control modules, the TCM depends on stable supply voltage for accurate operation and may report voltage-related diagnostic information.

An anti-lock brake system (ABS) control module controls braking functions intended to prevent wheel lock-up during braking events. The ABS module monitors wheel speed sensors and modulates brake pressure to maintain traction and vehicle stability. In many vehicles, the ABS module also supports electronic stability control and traction control functions. Because braking systems are safety-critical, the ABS module is sensitive to voltage fluctuations and may detect and report abnormal supply voltage conditions.

A supplemental restraint system (SRS) module, sometimes referred to as an airbag control module, manages deployment of occupant protection devices such as airbags and seatbelt pretensioners. The SRS module continuously monitors crash sensors, seat occupancy sensors, and system health. The SRS module is typically designed with redundant power paths and energy storage to ensure operation during crash events, and it monitors supply voltage to detect electrical faults that could impair system readiness.

A body control module (BCM) manages a wide range of non-powertrain vehicle functions, including lighting, door locks, windows, mirrors, interior electronics, and comfort features. The BCM often acts as a central coordinator for body-related systems and may interface with multiple vehicle networks. Because it supplies or controls power to many downstream loads, the BCM's supply voltage behavior can be indicative of broader power distribution issues.

An instrument panel control (IPC) module, also referred to as an instrument cluster module, controls the vehicle's gauges, indicators, warning lamps, and driver information displays. The IPC module receives data from other control modules and presents vehicle status information to the driver. Accurate voltage supply is important for correct display operation, and voltage irregularities may result in dim displays, erroneous indications, or warning messages.

OBD-II diagnostic tools, sometimes referred to as scan tools or dongles, interface with the DLC to request and receive data from ECUs. These tools can poll individual ECUs for live data, retrieve stored DTCs, clear fault codes, and monitor operating conditions over time. The data obtained through OBD-II provides a standardized, software-accessible view of vehicle behavior as interpreted by the ECUs themselves. However, this view is inherently filtered by each ECU's internal sensing, reporting capabilities, and communication timing.

Together, the OBD-II diagnostic interface, the networked ECUs, and the standardized diagnostic data form the backbone of modern vehicle diagnostics. They enable external tools to observe and analyze vehicle operation without direct physical access to sensors or wiring, and they provide a common platform upon which diagnostic methods and systems are built.

Vehicle electrical systems have grown steadily more complex as modern vehicles have incorporated increasing numbers of electronic control units, sensors, actuators, and networked subsystems. Contemporary vehicles commonly include dozens of ECUs distributed throughout the vehicle to manage powertrain functions, safety systems, body electronics, infotainment, and driver assistance features. Each of these modules relies on stable electrical power and proper grounding to operate correctly, and many vehicle faults manifest as electrical anomalies rather than purely mechanical failures.

Traditionally, vehicle electrical diagnostics have focused on identifying discrete faults reported by individual control modules. OBD systems were developed to provide standardized access to diagnostic trouble codes and selected live operating parameters. Through an OBD interface, a diagnostic tool can retrieve fault codes, monitor sensor values, and observe certain system-level parameters as perceived by a particular ECU. While this capability has greatly improved fault identification, OBD systems are inherently limited to what each ECU reports internally and do not directly measure electrical conditions at other points in the vehicle's power distribution network.

In parallel, technicians have long relied on external electrical test instruments, such as voltmeters, battery testers, and power probes, to evaluate the health of a vehicle's electrical system. These tools typically measure voltage, current, or resistance at specific physical points, such as battery terminals, connectors, or ground points. Battery testers and charging system analyzers can assess battery state of charge, cranking performance, and alternator output, while handheld voltmeters allow point-to-point measurements during troubleshooting. However, these tools generally operate independently of vehicle diagnostic systems and require manual interpretation by a technician to correlate measurements taken at different locations and times.

As vehicles have become more electronically dense, diagnosing electrical issues has become increasingly challenging. Many electrical faults do not present as simple open circuits or complete power loss. Instead, issues such as high-resistance connections, corroded terminals, degraded grounds, or partially failing distribution components can cause subtle voltage drops that affect only certain subsystems. These conditions may appear intermittently, vary with load or operating state, and impact multiple ECUs that share a common power feed or ground path. Such faults can lead to cascading symptoms, inconsistent diagnostic trouble codes, or performance anomalies that are difficult to reproduce.

Existing diagnostic approaches often treat electrical measurements in isolation. In modern vehicles, on-board diagnostic systems provide limited visibility into electrical operating conditions through standardized diagnostic parameters. Under standardized OBD-II protocols, a single control module may report a voltage parameter indicative of the supply voltage observed at that reporting module. This voltage parameter reflects the electrical potential available at the reporting module input or internal supply rail and can indicate that the control module is experiencing a reduced voltage condition. There is no context as to whether the underlying cause is a weak battery, a charging system issue, a shared distribution problem, or a localized wiring or grounding fault. Similarly, a battery or charging system test may indicate acceptable performance at the battery terminals while downstream modules experience degraded voltage under load. Bridging these perspectives typically requires a skilled technician to mentally correlate measurements from different tools and data sources, often relying on experience rather than systematic analysis.

Another complicating factor is the structure of vehicle wiring information. Detailed OEM wiring diagrams are complex, vehicle-specific, and frequently proprietary. While they provide comprehensive information about physical wire routing and connector pinouts, they are often cumbersome to use during diagnostics and may not be readily available outside dealership environments. Simplified wiring views or block diagrams are commonly used in practice to reason about functional power and ground relationships, but these abstractions are typically applied manually rather than being integrated into automated diagnostic processes.

Timing and persistence also play a significant role in electrical diagnostics. Electrical anomalies may occur only during certain operating conditions, such as engine cranking, high accessory load, or specific driving states. Transient voltage fluctuations can be benign, while sustained or repeatedly occurring drops may indicate underlying faults. Conventional diagnostic tools often capture snapshots or short samples of data, making it difficult to distinguish between transient behavior and persistent electrical problems without extended observation or repeated testing.

Taken together, these factors illustrate the state of the art leading up to the present disclosure: vehicle diagnostics rely on a combination of limited ECU-reported information and independent electrical measurements, each offering a narrow view of the vehicle's electrical health. Diagnosing complex power distribution and grounding issues frequently depends on manual correlation of disparate data sources, technician experience, and iterative testing, rather than on systematic, automated analysis of electrical behavior across the vehicle.

BRIEF SUMMARY

In accordance with an example embodiment of the present disclosure, a system is provided for diagnosing electrical power distribution conditions in a vehicle using information obtained from multiple, independent sources. The system includes a digital computing device, suitably a portable computing device, such as a smartphone or tablet, that cooperates with an on-board diagnostic interface device connected to the vehicle's diagnostic link connector and with a voltage measurement device connected directly to the vehicle battery terminals. The diagnostic interface device retrieves diagnostic data from one or more electronic control units in the vehicle, including at least one parameter that reflects a supply voltage experienced by a control module. Separately, the voltage measurement device measures battery-terminal voltage independently of the vehicle's control modules.

During a diagnostic session, the portable computing device receives diagnostic data from the on-board diagnostic interface device and battery-terminal voltage measurements from the voltage measurement device at the same time or during overlapping intervals. The portable computing device correlates the control-module-reported supply voltage parameter with the independently measured battery-terminal voltage over time. By evaluating how these values relate to one another, the system determines whether an observed voltage anomaly originates at the battery or charging system, or instead arises along a downstream power distribution path that supplies one or more electronic control units.

In other example embodiments, the portable computing device maintains simultaneous communication sessions with the on-board diagnostic interface device and the voltage measurement device using one or more wireless communication protocols. The devices operate independently and do not require direct communication with one another. The portable computing device manages asynchronous data reception from the two sources and associates received measurements with timing information to enable later correlation.

In further example embodiments, the portable computing device buffers received diagnostic data and battery-terminal voltage measurements and evaluates the buffered data over one or more evaluation windows. This allows the system to distinguish transient voltage fluctuations, such as those associated with engine cranking or short-duration load changes, from sustained voltage deviations that are more indicative of an electrical fault. Persistence logic is applied so that brief or expected voltage changes are not misclassified as faults.

When timing alignment between diagnostic data and battery-terminal voltage measurements is uncertain or insufficient, the system evaluates an alignment quality between the two data streams. If the alignment quality does not satisfy a defined criterion, the system applies a dynamic time warping process to generate an alignment mapping between the diagnostic data and the battery-terminal voltage measurements. This adaptive alignment allows meaningful comparison of voltage behavior even when the two data streams are sampled at different rates or experience communication latency.

In other example embodiments, the system classifies a detected voltage anomaly based on comparative voltage behavior over time. For example, the system can determine whether a voltage anomaly corresponds to a battery condition, a charging system condition, a shared power distribution condition affecting multiple control modules, or a localized wiring or grounding condition affecting a specific control module. This classification is based on how control-module-reported supply voltage parameters compare to battery-terminal voltage measurements and how those relationships persist over time.

In embodiments where diagnostic data includes supply voltage parameters reported by multiple electronic control units, the portable computing device compares voltage parameters across different control modules. By identifying which control modules exhibit similar voltage deviations and which do not, the system determines whether a voltage anomaly affects a subset of control modules that share a common power distribution path. This comparison helps isolate likely locations of electrical faults within the vehicle's power distribution network.

In other example embodiments, the portable computing device generates a diagnostic output that includes a visual wiring representation. The wiring representation highlights one or more suspected power distribution elements positioned between the vehicle battery and an affected electronic control unit. The highlighted elements are identified based on the correlated voltage measurements and comparative analysis, providing actionable guidance for inspection or repair.

In additional example embodiments, the diagnostic functionality is implemented at least in part by software stored on a non-transitory computer-readable medium. When executed by a processor of a portable computing device, the software causes the device to establish communication sessions with the on-board diagnostic interface device and the voltage measurement device, receive diagnostic and voltage measurement data, correlate control-module-reported supply voltage parameters with battery-terminal voltage measurements, and determine the origin of detected voltage anomalies. The software can further manage concurrent communication, apply buffering and persistence logic, invoke dynamic time warping when needed, perform multi-module comparative analysis, and generate graphical diagnostic outputs, including wiring representations that highlight suspected power distribution elements.

BRIEF DESCRIPTION OF THE DRAWINGS

These and other features and advantages of the various embodiments disclosed herein will be better understood with respect to the following description and drawings, in which:

FIG. 4 is an example graphical user interface presented on a portable computing device;

FIG. 5 is a table illustrating example control-module-reported supply voltage parameters obtainable through a diagnostic interface and their diagnostic significance.

FIG. 6 is a table illustrating example manufacturer-specific control module voltage parameters and corresponding diagnostic access mechanisms;

FIG. 7 is a table illustrating example ECU-reported voltage values evaluated relative to a battery-terminal voltage reference;

FIG. 8 is a table illustrating example vehicle operating states and corresponding expected voltage behavior;

FIG. 9 is a table illustrating example voltage behavior patterns and associated diagnostic interpretations;

FIG. 10 is a table illustrating example data sources used by the system and the origin of each type of diagnostic information;

FIG. 11 is a table illustrating example processing functions performed by a remote computing system in conjunction with the portable computing device; and FIG. 12 is a table illustrating example persistence-based evaluation logic for distinguishing transient voltage events from sustained voltage anomalies.

DETAILED DESCRIPTION

Figure 1:
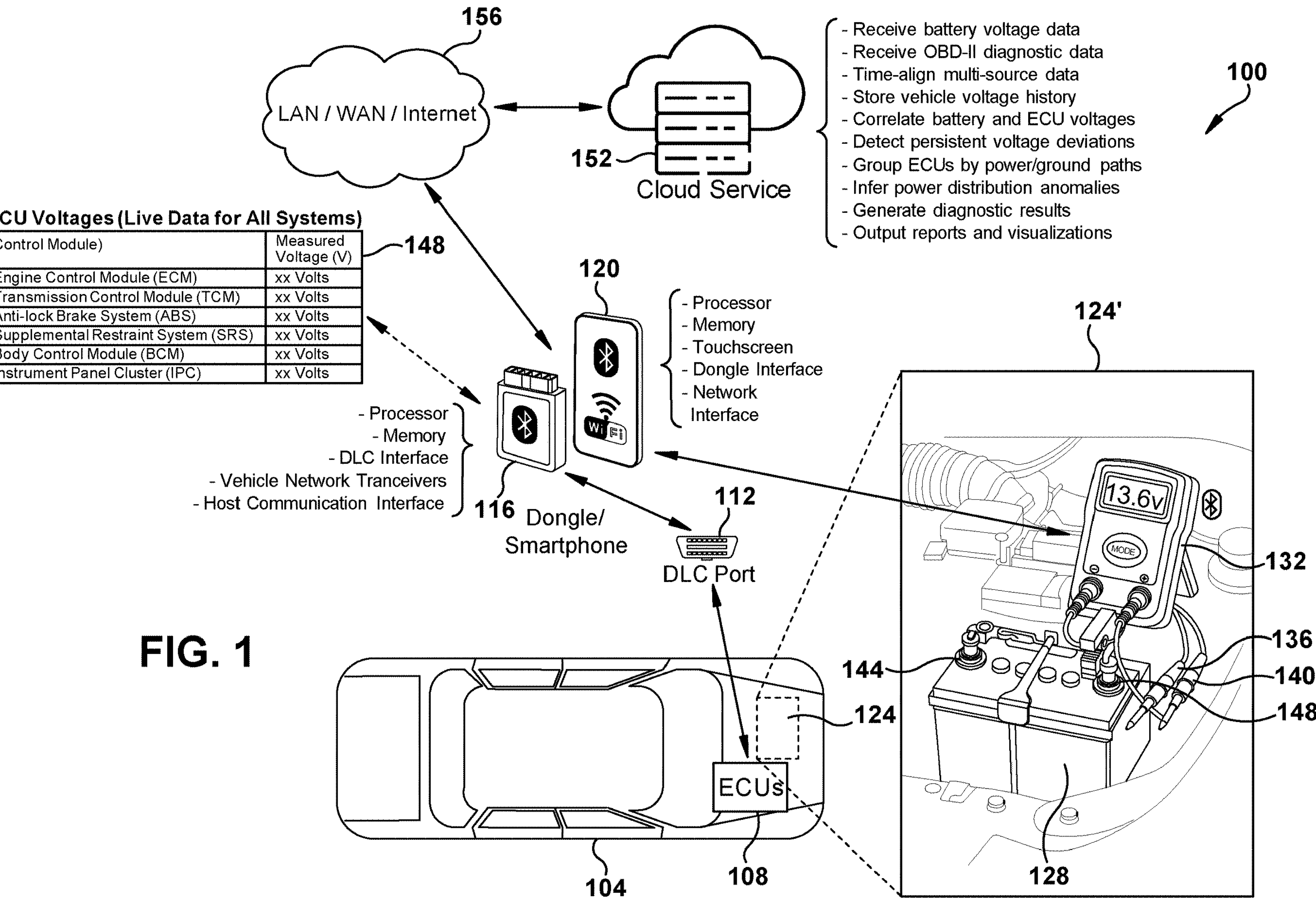
FIG. 1 illustrates an example embodiment of system for diagnosing vehicle power distribution using battery-terminal and ECU-reported voltage correlation.

The detailed description set forth below in connection with the appended drawings is intended as a description of certain embodiments of a vehicle diagnostic system and related method, and is not intended to represent the only forms that may be developed or utilized. The description sets forth the various structure and/or functions in connection with the illustrated embodiments, but it is to be understood, however, that the same or equivalent structure and/or functions may be accomplished by different embodiments that are also intended to be encompassed within the scope of the present disclosure. It is further understood that the use of relational terms such as first and second, and the like are used solely to distinguish one entity from another without necessarily requiring or implying any actual such relationship or order between such entities.

The present disclosure uses a focused subset of OBD-II information, selected for its relevance to electrical and power-supply analysis rather than for general vehicle performance diagnostics. The information is drawn from ECUs via the OBD-II interface and is used primarily as a contextual and comparative signal when correlated with battery-terminal voltage measurements.

ECU-reported supply or system voltage values are a primary input. Many ECUs report an internal supply voltage or system voltage parameter that reflects the voltage level available to that module during operation. These values, referred to in the disclosure as local internal vehicle voltage (LIVV), are obtained via OBD-II and serve as a representation of the electrical conditions experienced at or within each ECU. As used herein, LIVV refers to a voltage value reported by an ECU as measured at, or internal to, that ECU, rather than the battery-terminal voltage.

Example embodiments compare these ECU-reported voltages to a battery-terminal reference to detect voltage drops, mismatches, and distribution anomalies.

Diagnostic trouble codes and status information are used to provide context and triggering rather than as the sole basis for diagnosis. Changes in DTCs, the appearance of power-related codes, or fault flags from specific ECUs can initiate or prioritize analysis. The presence or absence of DTCs also helps distinguish between electrical supply issues and functional faults internal to a module.

In the context of this invention, the additional information needed to move from detecting an electrical anomaly to tracing it to a specific cause is information that standard OBD-II does not provide. That additional information falls into a few clear categories, each of which fills a specific diagnostic gap.

First, an independent battery-terminal voltage measurement is obtained via a voltmeter. Standard OBD-II does not report battery-terminal voltage, only the voltage observed locally at a reporting control module. A direct measurement at the battery terminals establishes a true source-level reference. Without this reference, it is not possible to determine whether a low ECU-reported voltage originates at the battery or occurs downstream along a distribution path.

Second, time-correlated voltage measurements are implemented. OBD-II voltage data and battery-terminal voltage data are typically acquired asynchronously and at different sampling rates. Time alignment of these measurements over a defined evaluation window allows relative voltage behavior to be compared under the same operating conditions. Persistence of a deviation over time is critical to distinguishing sustained distribution faults from brief transient events.

Third, comparative voltage information across multiple control modules, when available, provides added context. While standardized OBD-II typically exposes voltage from only a single reporting module, manufacturer-specific diagnostic parameters can, in some vehicles, provide supply voltage information for additional ECUs. Comparing voltage behavior across multiple modules allows the system to determine whether a condition is system-wide or localized to a subset of modules sharing a common power or ground path.

Fourth, persistence and pattern information is suitably utilized. Instantaneous voltage readings alone are insufficient to identify meaningful electrical faults. Evaluating how long a voltage deviation persists, how often it recurs, and whether it appears consistently across operating states allows the system to classify the anomaly as transient, intermittent, or sustained. This temporal information is not conveyed by a single OBD-II snapshot.

Finally, power distribution context information is suitably utilized to translate voltage comparisons into actionable diagnostic guidance. This can include logical grouping of control modules based on shared power feeds or ground paths, simplified wiring topology information, or inferred relationships derived from observed voltage behavior. This contextual information allows a detected voltage mismatch to be associated with likely distribution elements, such as a shared fuse, connector, splice, or ground point, rather than leaving the diagnosis at the level of a generic low-voltage condition. Operating state and contextual parameters are used to interpret voltage behavior correctly. These parameters can include engine speed, engine running state, charging status, and other indicators that reflect whether the vehicle is cranking, idling, charging, or under load. This context allows the system to apply appropriate thresholds and expectations for voltage behavior in different operating modes.

Timing and update characteristics of OBD data are suitably used to manage correlation and persistence analysis. Example embodiments account for the fact that different ECUs update reported parameters at different rates and with different latencies. Timestamp information associated with OBD frames is used to align ECU-reported voltage data with battery-terminal voltage measurements over a rolling time window.

Example embodiments use ECU identification and grouping information is to associate reported voltage values with specific control modules and functional systems. This information allows the system to group ECUs that share common power feeds or ground paths and to analyze patterns across multiple modules rather than in isolation.

Notably, example embodiments do not rely on OBD-II for direct measurement of wiring resistance, current flow, or physical circuit topology. Instead, OBD-II information is used as a distributed sensing mechanism that reflects how electrical conditions manifest at multiple modules throughout the vehicle. When combined with an independent battery-terminal voltage reference, this OBD-II information enables the system to infer power-supply, power-feed, and ground-path conditions that are not directly observable through OBD-II alone.

FIG. 1 illustrates an example embodiment of system 100 for diagnosing vehicle power distribution using battery-terminal and ECU-reported voltage correlation. Vehicle 104 includes ECUs 108 which are accessible for data communication via DLC port 112. DLC 112 is configured to receive data connection to a scan tool, illustrated in the example as dongle 116 working in concert with a digital device, such as smartphone 120. Examples of suitable dongles include the INNOVA 321RS and INNOVA 1000 available from Innova Electronics Corporation of Irvine, California.

An engine compartment 124, with an expanded view 124', includes a battery 128. Voltmeter 132 includes a probe pair comprised of probe 136 and probe 140, configured to be placed in electrical contact with terminals 144 and 148 facilitating measurement of an output voltage of battery 128.

In some example embodiments, the voltmeter communicates directly with the smartphone or computing device (for example via Bluetooth) and streams voltage readings at a defined sampling rate. In that case, the phone receives battery voltage in near real time while simultaneously receiving OBD data from the dongle. The voltage measurement device is suitably comprised of a commercially available battery-mounted voltage monitor configured to measure electrical potential directly at one or more terminals of a vehicle battery. Such devices typically include an internal voltage reference and an analog-to-digital converter for generating digital representations of battery-terminal voltage over time. The voltage measurement device can be physically coupled to the battery terminals using clamps, ring terminals, or other conductive interfaces that provide continuous electrical contact.

In some embodiments, the voltage measurement device is configured to transmit measured voltage values to a portable computing device using a wireless communication interface. Suitable wireless interfaces include short-range communication protocols such as Bluetooth Classic or Bluetooth Low Energy, although other wired or wireless communication mechanisms can be used. The voltage measurement device can transmit voltage samples continuously, periodically, or in response to detected electrical events, and can associate transmitted samples with timing information, such as timestamps or sequence identifiers.

In further example embodiments, the voltage measurement device includes local memory for storing voltage samples when a communication link is unavailable, and subsequently transmits stored samples to the portable computing device when the communication link is restored. The voltage measurement device can operate passively, measuring naturally occurring voltage behavior at the battery terminals without injecting current or applying external test voltages.

In other example embodiments, the voltmeter records voltage measurements locally with timestamps and later transfers those measurements in batches to the phone or to a server. The voltage data can then be time-aligned with OBD data after the fact. Because the system evaluates voltage behavior over defined evaluation windows and looks for persistent deviations rather than instantaneous events, continuous real-time streaming is not strictly required. In further example embodiments, the voltmeter communicates indirectly through an intermediary device or network, or uploads measurements directly to a cloud server, where the correlation with OBD data is performed.

Dongle 116 is configured to receive ECU voltage-related readings 148 from one or more control modules, such as an ECM, a TCM, an ABS module, a SRS module, a BCM and an IPC module.

Smartphone 120 is also in data communication with a cloud service server 152 via network cloud 156. The network cloud is suitably comprised of one or more of a local area network (LAN), and a wide area network (WAN) that may comprise the Internet. Data communication is via any suitable wireless or wired communication path, or combination thereof.

In example embodiments, the cloud service provides centralized computational, analytical, and data-management functions supporting one or more vehicle-connected diagnostic tools, mobile devices, or local processing systems. The cloud service is depicted as a logical aggregation of network-accessible resources rather than a single physical server and suitably comprises one or more distributed computing nodes, storage systems, and application services operating cooperatively.

In example embodiments, the cloud service suitably receives uploaded vehicle data originating from one or more remote devices, including diagnostic trouble codes, freeze-frame data, live operating parameters, exterior geometric measurements, sensor telemetry, and associated metadata. The cloud service suitably normalizes, canonicalizes, and persists such data in one or more structured data repositories, enabling later retrieval, correlation, replay, or audit.

In further example embodiments, the cloud service executes diagnostic decision logic, correlation engines, and analytical models, including rule-based logic, statistical analysis, pattern recognition, or machine-learning-based classifiers. Such processing suitably evaluates relationships between disparate data sources, including correlations between exterior geometric deviations and internal diagnostic parameter variations that are individually insufficient to indicate a fault condition.

In additional example embodiments, the cloud service performs version management and pinning functions, including maintaining identifiers for diagnostic logic versions, correlation models, reference datasets, and decision thresholds used during a given diagnostic session. These identifiers are suitably associated with generated outputs to support deterministic replay, validation, or dispute resolution.

In example embodiments, the cloud service generates structured outputs, including diagnostic summaries, condition assessments, confidence scores, alerts, visual overlays, repair recommendations, parts lists, labor estimates, or repair order data. Such outputs are suitably formatted for presentation on remote user interfaces, transmission to third-party systems, or storage as part of a persistent diagnostic record.

In still further example embodiments, the cloud service provides security and integrity functions, including cryptographic hashing, tamper-evident signing, authentication, authorization, access logging, and data provenance tracking. These functions suitably ensure that diagnostic records, analytical results, and generated reports remain verifiable and resistant to unauthorized modification. In other example embodiments, the cloud service supports fleet-level aggregation, trend analysis, population-level model refinement, and longitudinal tracking across multiple vehicles or diagnostic sessions, without requiring local devices to maintain complete historical datasets.

Figure 2:
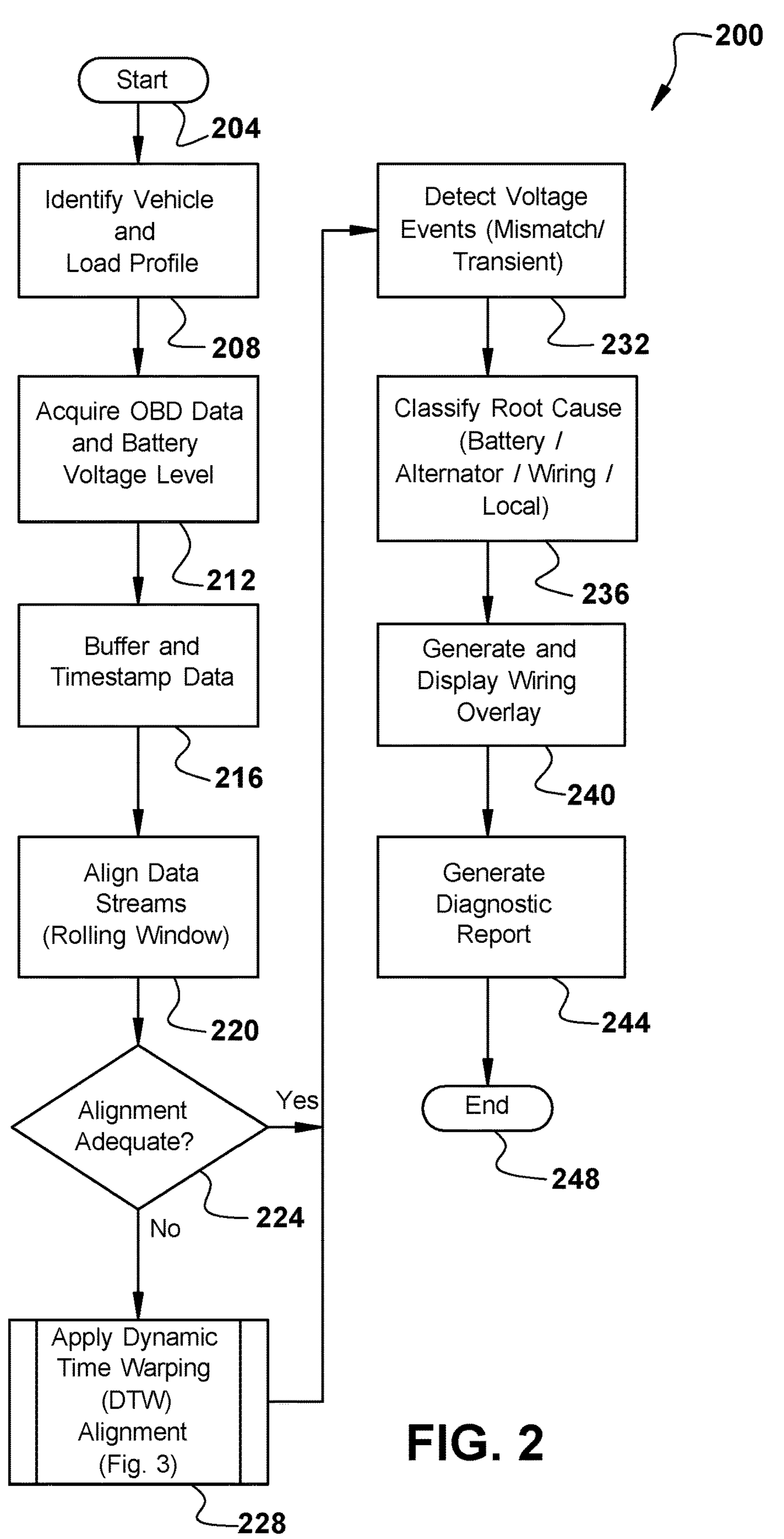
FIG. 2 is a flowchart of an example embodiment of a system for diagnosing vehicle power distribution using battery-terminal and ECU-reported voltage correlation

FIG. 2 illustrates a flowchart 200 of an example embodiment of a system for diagnosing vehicle power distribution using battery-terminal and ECU-reported voltage correlation. The system commences at block 204 where it initiates a diagnostic session for a vehicle, which can include establishing communication with an OBD interface device connected to the vehicle DLC and initializing a voltage measurement device coupled to the vehicle battery terminals. Vehicle identification information is obtained at block 208 which is used used to load vehicle-specific parameters or profiles relevant to electrical diagnostics.

Next, at block 212, the system acquires one or more control-module-reported supply voltage parameter from the vehicle via the OBD interface device and acquires battery-terminal voltage measurements from the voltage measurement device. As used herein, the term "control-module-reported supply voltage parameter refers to any parameter reported by an electronic control module that represents, reflects, or is indicative of an electrical supply voltage available to the control module during operation. The parameter can correspond to a voltage directly measured by the control module at a power input or internal supply rail, or to a voltage value derived, computed, scaled, normalized, or otherwise generated by the control module based on sensed electrical conditions.

The control-module-reported supply voltage parameter can be obtained through standardized diagnostic protocols or manufacturer-specific diagnostic services and can be expressed as a numerical voltage value, an encoded or scaled value convertible to voltage, a statistical value such as a minimum or maximum voltage observed over an interval, or another representation that conveys supply voltage conditions experienced by the control module.

In all cases, the control-module-reported supply voltage parameter reflects voltage conditions downstream of the vehicle battery and associated power distribution elements and is suitable for evaluation relative to an independently measured battery-terminal voltage.

The diagnostic data can include control module voltage parameters, diagnostic trouble codes, and operating-state information. Battery-terminal voltage measurements provide a source-level electrical reference independent of the vehicle control modules. Acquired OBD data and battery-terminal voltage data are buffered and associated with timing information at block 216. Each data sample is stored with a timestamp or sequence identifier, enabling evaluation of voltage behavior over defined evaluation windows rather than as isolated instantaneous measurements.

Next, at block 220, the system performs an initial alignment of the buffered data streams using a rolling-window or time-proximity alignment technique. This alignment associates battery-terminal voltage samples with corresponding OBD-derived voltage samples based on expected sampling characteristics and temporal proximity. At block 224, the system evaluates whether the alignment between the data streams is sufficient for reliable comparative analysis. Alignment sufficiency can be determined based on criteria such as timing offset, continuity of data, or consistency of voltage features within the evaluation window.

If the alignment is determined to be insufficient, the method proceeds to block 228, where a dynamic time warping (DTW) alignment process is invoked. The DTW process, as detailed below in connection with FIG. 3, refines temporal correspondence between the battery-terminal voltage data and the OBD-derived voltage data to compensate for sampling jitter, transport latency, or differing update rates. For a more detailed discussion of the use of DTW in the context of automotive diagnostics, as well as the use of various "puck" sensors, certain embodiments of which may include a voltage measurement puck sensor, please refer to U.S. Pat. No. 12,412,432, issued Aug. 27, 2025, and U.S. patent application Ser. No. 19/320,376, filed Sep. 5, 2025 and entitled SYSTEM AND METHOD FOR VEHICLE DIAGNOSTICS WITH SYNCHRONIZED VEHICLE ACOUSTIC AND VIBRATION DATA WITH ON-BOARD DIAGNOSTIC DATA the contents of both of which are incorporated herein by reference in their entirety. Upon completion of the DTW process, the system proceeds to block 232 where voltage events are detected. If the alignment is determined to be sufficient at block 224, the system proceeds directly to block 232. Voltage events can include sustained deviations between ECU-reported voltage and battery-terminal voltage, as well as transient fluctuations. The system distinguishes transient events from sustained deviations based on defined magnitude and duration criteria.

At block 236, the system classifies the detected voltage events to determine a likely root cause. Classification can include identifying conditions indicative of a battery fault, a charging system anomaly, a shared power or ground distribution issue, or a localized wiring or connector fault affecting one or more control modules.

The system generates and displays a wiring overlay corresponding to the classified condition at block 240. The wiring overlay suitably highlights relevant power distribution paths, shared feeds, connectors, or ground points associated with the affected control modules, thereby guiding further inspection or corrective action. The system then generates a diagnostic report at block 240 summarizing the detected voltage events, the inferred root cause, and the affected vehicle systems or control modules. The diagnostic report can include voltage values, status indicators, and visual elements derived from the wiring overlay, and can be displayed to a user, stored, or transmitted to a remote server. The system then terminates at block 248.

Figure 3:
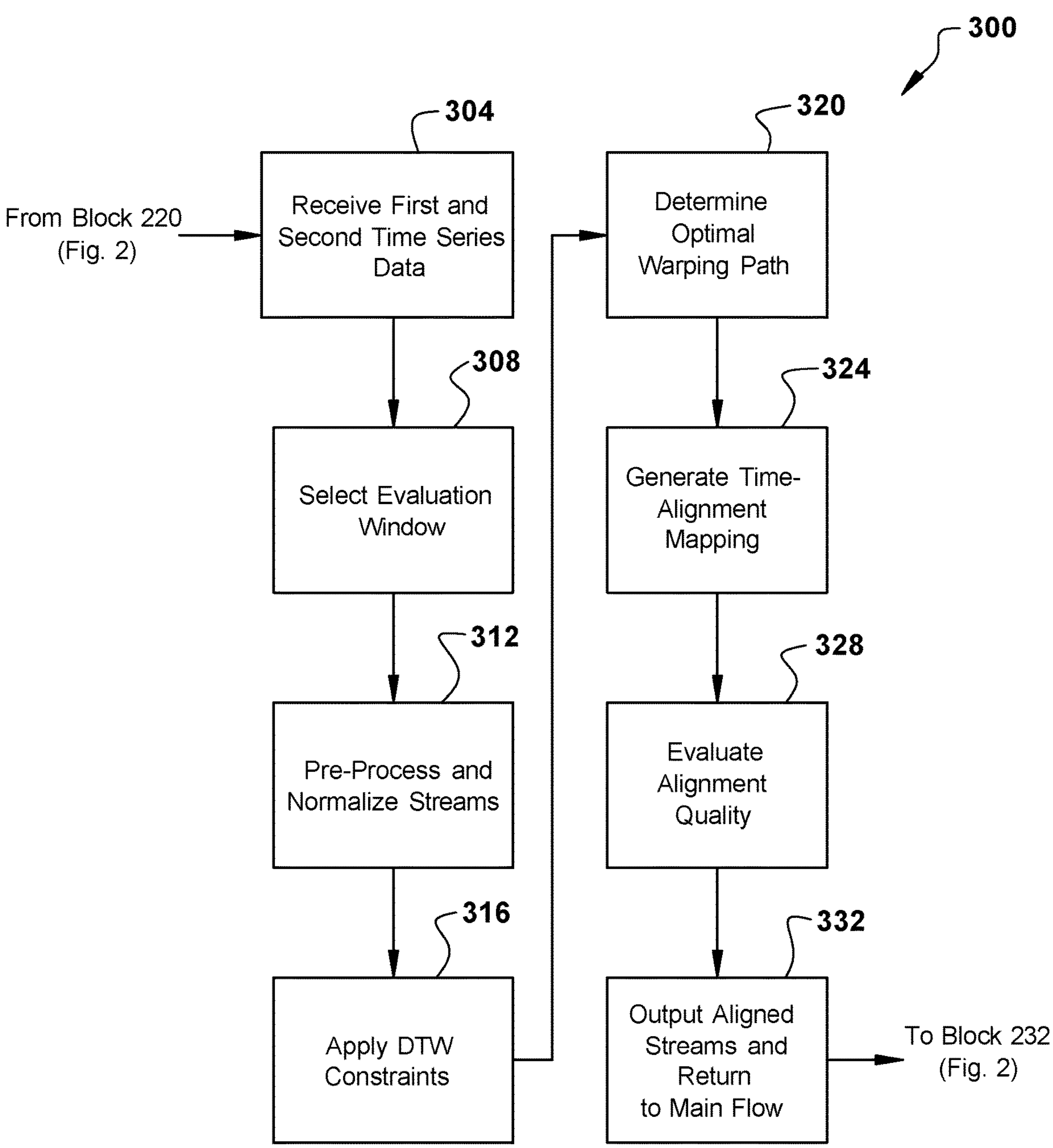
FIG. 3 is a flowchart 300 detailing an example embodiment of the dynamic time warping process in block 228 of FIG. 2.

FIG. 3 illustrates a flowchart 300 detailing an example embodiment of the DTW process in block 228 of FIG. 2, proceeding from block 224 when battery voltage stream and ECU voltage information stream alignment is inadequate. First, at block 304, the DTW alignment subroutine receives, as inputs, a first time series representing battery-terminal voltage measurements acquired from a battery-mounted voltage measurement device and a second time series representing ECU-reported voltage measurements acquired via an OBD interface device. Each sample in each time series is associated with a timestamp, and each time series is provided for a common evaluation window. The subroutine also receives one or more configuration parameters, which can include a window duration, an allowable warp constraint, a normalization method, and an alignment-quality threshold.

Next, at block 308, the system selects an evaluation window from buffered data for which the alignment deficiency was detected. In example embodiments, the evaluation window is selected to include a contiguous time interval that contains one or more voltage features, such as a charging transition, a load-induced dip, or a cranking event, that can be used as an alignment signature. The selected window is sized to provide sufficient signal structure for alignment while limiting computational overhead.

The system then preprocesses the battery-voltage stream and the ECU-voltage stream to improve robustness of alignment at block 312. Preprocessing can include resampling to a common sampling interval, interpolating missing samples, smoothing high-frequency noise, removing DC offsets, and normalizing amplitude. In some embodiments, the system transforms each stream into a feature representation, such as a first derivative, a band-limited waveform, or an event-coded sequence, so that alignment is driven by voltage-shape similarity rather than absolute magnitude.

Next, at block 316, the system applies one or more constraints to bound the DTW search space. In example embodiments, the system enforces a monotonicity constraint such that time ordering is preserved and enforces a locality constraint such that a sample at a given time in one stream can map only to samples within a bounded neighborhood in the other stream. The constraints reduce computational complexity and prevent unrealistic warping that would not correspond to plausible time misalignment between the streams. The system then computes a DTW cost matrix over the selected evaluation window. The cost matrix is computed based on a distance metric between samples or features of the two streams, such as an absolute difference, squared difference, or a feature-distance metric. The cost matrix defines an accumulated alignment cost for mapping the battery-voltage samples to ECU-voltage samples under the applied constraints.

Next, at block 320, the system determines an optimal warping path through the cost matrix that minimizes accumulated alignment cost while satisfying the DTW constraints. The warping path defines a mapping between time indices of the battery-voltage stream and time indices of the ECU-voltage stream. The mapping can include one-to-one correspondences as well as limited one-to-many or many-to-one correspondences, which account for differing sampling rates or transient buffering delays. At block 324, the system then generates, based on the warping path, a time-alignment mapping that allows samples of the battery-voltage stream and samples of the ECU-voltage stream to be compared as aligned pairs. In some embodiments, the system produces a re-timestamped version of one stream, an index mapping table, or a resampled aligned sequence. The mapping is associated with the evaluation window and can be stored as an alignment artifact for auditability or later analysis.

Next, at block 328 the system evaluates the quality of the DTW-derived alignment. In example embodiments, alignment quality is assessed based on one or more metrics, such as normalized alignment cost, average residual error after alignment, warping magnitude, or consistency of alignment across overlapping sub-windows. If alignment quality fails to meet a defined threshold, the system flags the window as unreliable for voltage comparison and either selects a different window or reverts to a default alignment method. When alignment quality meets the defined threshold, the DTW alignment subroutine outputs the alignment mapping and aligned data pairs to the main diagnostic flow at block 332. The main diagnostic flow then proceeds to evaluate ECU-reported voltage relative to the battery reference using the aligned data pairs, including applying persistence criteria and classification logic. The DTW subroutine returns an alignment status indicator that indicates whether DTW alignment was applied and whether alignment quality was satisfactory.

In some embodiments, the system stores the DTW mapping, alignment metrics, and associated evaluation window identifiers in memory, such as within a cloud server, to support reproducibility, audit trails, or later comparative analysis. In further embodiments, the system reuses prior alignment parameters or mapping characteristics for subsequent windows during the same diagnostic session when the operating state and sampling characteristics remain consistent.

Example pseudocode to realize a correlated OBD and voltmeter correlation analysis system follows.

```
  OBD Dongle+Battery-Terminal Volt Meter (Power
    Check) Correlation Diagnostics
Data Structures
  VehicleProfile: {voltageRanges, expectedOffsetsByECU,
    tolerancesByECU, persistenceMs, transientMs,
    modeRules}
  ECUMap: {ECU_id→{systemName, powerGroupld,
    groundGroupld}}
  WiringView: simplified functional power/ground paths
    for overlay
  Buffers: {OBDFrames [ ], PwrFrames [ ]}
  Event: {type, startTime, endTime, affectedECUs, vbat-
    Stats, vecuStats, context, class, confidence}
  Report: {vehicleId, events [ ], overlays [ ], recommenda-
    tions [ ]}
Main( )
  vehicleId: =Identify Vehicle( )
  profile:=LoadVehicleProfile(vehicleId)
  ecuMap:=LoadECUMap(vehicleId)
  wiring:=LoadWiringView(vehicleId)
  StartOBDSession( )
  StartPowerCheckSession( )
  loop while sessionActive:
    OBDFrames.append(ReadOBDFrame( ))//timestamp,
      per-ECU voltages if available, DTC deltas, context
    PwrFrames.append(ReadPowerFrame( ))//timestamp,
      battery terminal voltage, optional test metrics
    TrimBuffersToWindow(OBDFrames, PwrFrames)
    if TriggerAnalysis(OBDFrames, PwrFrames, profile):
      aligned:=AlignByTimestampRollingWindow(OBD-
        Frames, PwrFrames)
    if NeedRefinedAlignment(aligned, profile)://optional
      embodiment
      aligned:=WarpingAlign(aligned,
        constraints=profile.modeRules)
    events:=DetectEvents(aligned, profile)
    events:=ClassifyEvents(events, aligned, profile,
      ecuMap)
    overlays:=BuildWiringOverlays(events, ecuMap, wir-
      ing)
    report:=BuildReport(vehicleId, events, overlays, pro-
      file)
    Present(report)
Identify Vehicle
  IdentifyVehicle( )
    vin:=ReadVINviaOBDO else vin:=UserlnputVehi-
      cleId( )
    return vin
```

```
Reading Functions
  ReadOBDFrame( )
    t:=Now( )
    dtcs:=ReadDTCsIfChanged( )
    vecu:=ReadECUVoltagesAcrossSystems( )//for each
      ECU: supply/system voltage PID if supported
    ctx:=ReadContextPIDs( )//rpm, charging state indica-
      tors, load indicators as available
    return {t, dtcs, vecu, ctx}
  ReadPowerFrame( )
    t:=Now( )
    vbat:=MeasureBatteryTerminalVoltage( )//at clamps,
      used as reference
    metrics:=OptionalBatteryTestsIfRunning( )//cranking
      drop, ripple, charging stability
    return {t, vbat, metrics}
Alignment
  AlignByTimestampRollingWindow(OBDFrames, Pwr-
    Frames)
    window:=GetRecentInterval( )
    for each obdf in OBDFrames within window:
      vbat:=NearestOrInterpolated(PwrFrames, obdf.t)
      yield tuple {t=obdf.t, vbat, vecu=obdf.vecu,
        ctx=obdf.ctx, metrics=NearestMetrics(Pwr-
        Frames, obdf.t)}return alignedTuples
  NeedRefinedAlignment(aligned, profile)
    return (HighOBDJitter(aligned) OR HighLatencyDrift
      (aligned) OR OutOfPhaseEvents(aligned) OR Rip-
      pleAnalysisNeeded(aligned))
  WarpingAlign(aligned, constraints)
    //align sequences within bounded window using a
      monotonic warping path (e.g., DTW-style) and con-
      straints
    return RefinedAlignedTuples
Event Detection
  DetectEvents(aligned, profile) candidates:=[ ]
    for each tuple k in aligned:
      for each ECU_i with Vecu_i present:
        expected:=profile.expectedOffsetsByECU
          [ECU_i]adjusted by k.ctx
        tol:=profile.tolerancesByECU[ECU_i]adjusted by
          k.ctx
        delta:=(k.vbat-k.vecu[ECU_i])-expected
        if |delta|>tol:
        candidates.add({ECU_i, k.t, delta})
      DetectBatteryTransientIfSlopeHigh(k, aligned, pro-
        file) mismatches:=GroupByECUAndPersist(can-
        didates, minDuration=profile.persistenceMs)
    transients:=GroupTransients
      (minDuration=profile.transientMs,
      maxDuration=profile.persistenceMs)
    return BuildEventList(mismatches, transients)
Classification
  ClassifyEvents(events, aligned, profile, ecuMap)
    for each event in events:
      vbatTrend:=BatteryBehaviorDuring(event, aligned)
      affected:=event.affectedECUs
      ratio:=|affected|/CountMonitoredECUs(aligned)
      if vbatTrend.lowOrUnstable AND ratio is high:
        ifAlternatorRippleOrChargingInstability(aligned,
          event):
          event.class:="ALTERNATOR_OR_CHARG-
          ING"
        else:
          event.class:="BATTERY_OR_MAIN FEED"
      else if vbatTrend.stable AND ratio is low:
        if ShareGroundGroup(affected, ecuMap):
          event.class:="GROUND_PATH_FAULT"
        else if SharePowerGroup(affected, ecuMap):
          event.class:="POWER_FEED_FAULT"
        else:
          event.class:="LOCAL_CONNECTOR_OR_
          MODULE"
      else:
        event.class:="UNDETERMINED"
      if event.type=="TRANSIENT" and RepeatsFre-
        quently(event, events, profile):
        event.class:="INTERMITTENT_POWER_
        FAULT"
      event.confidence:=ScoreConfidence(event, vbat-
        Trend, profile)
    return events
Wiring Overlay
  BuildWiringOverlays(events, ecuMap, wiring)
    overlays:=[ ]
    for each event in events:
      paths:=LikelyFunctionalPaths(event.affectedECUs,
        ecuMap, wiring)//power/ground groups, junc-
        tions, grounds
      overlays.add(Colorize(paths,
        severity=EventSeverity(event),
        probability=OptionalWeighting(event))) return
        overlays
Reporting
  BuildReport(vehicleId, events, overlays, profile)
    report.vehicleId:=vehicleId
    report.events:=events
    report.overlays:=overlays
    report.recommendations [ ]
    for each event in events:
      report.recommendations.add(RecommendedActions
        (event.class)) return report
```

The pseudocode describes an example embodiment in which vehicle power-supply issues are diagnosed by correlating a first voltage data stream obtained from vehicle electronic control units via an OBD interface with a second voltage data stream measured directly at battery terminals by a separate battery-mounted voltage measurement device. The system suitably establishes two parallel acquisition sessions. A first session is established via an OBD dongle coupled to a diagnostic link connector to acquire diagnostic information from one or more ECUs, including diagnostic trouble codes and live parameters. In particular, the dongle suitably acquires ECU-reported supply or system voltage values for multiple vehicle systems, and it suitably also acquires contextual operating parameters such as engine speed and charging state indicators. A second session is established via a Power Check device coupled to the battery terminals to acquire battery-terminal voltage as a reference signal, and the Power Check device suitably also acquires battery-test metrics under defined operating conditions, including cranking voltage drop, alternator ripple indicators, and charging voltage stability. The system suitably time-tags each acquired observation from each device, and it suitably maintains short-term buffers of recent observations so that transient events are preserved even when wireless transport introduces latency or batching.

In operation, the system suitably determines a vehicle identity, such as by reading a VIN via OBD or by receiving user-entered vehicle identification, and it suitably loads a vehicle profile corresponding to the identified vehicle. The vehicle profile suitably includes reference voltage ranges for one or more operating modes, expected offsets between battery-terminal voltage and ECU-reported voltage for specific ECUs or groups of ECUs, tolerances and persistence criteria for distinguishing transient fluctuations from sustained mismatches, and rules for interpreting data as a function of operating context. The system suitably loads a mapping of ECUs to functional groupings, including groupings that represent shared power feeds and shared grounds. The system suitably also loads a simplified functional wiring view that represents power and ground paths at the level of functional distribution, rather than requiring a full wire-by-wire OEM schematic, thereby enabling visualization of likely affected areas without dependence on proprietary wiring data.

The acquisition loop in the pseudocode is structured so that the dongle and the Power Check device each produce time-stamped frames. An OBD frame suitably includes per-ECU voltage values for those ECUs that support voltage reporting, updated DTC information, and operating context parameters. A power frame suitably includes a battery-terminal voltage measurement and any battery-test metrics that are active or available. The buffers are suitably trimmed to a rolling time window so that analysis operates on a bounded, recent interval, which supports near-real-time operation and reduces memory usage. The system suitably triggers analysis periodically, on demand, or upon detection of abnormal behavior, such as when DTCs change, when a voltage slope threshold is exceeded, or when observed deviations approach or exceed a configured tolerance band.

To correlate the two data streams, the system suitably aligns the OBD frames with the power frames in time. In one example implementation, the system uses a timestamp-based rolling-window alignment in which each OBD observation at time t is associated with a battery reference value derived from the nearest-in-time Power Check measurement, or from interpolation between adjacent Power Check samples that bracket time t. This alignment produces an aligned sequence of tuples, each tuple representing a consistent view at a given time that includes battery-terminal voltage, ECU-reported voltages, and operating context. Where alignment uncertainty is elevated, such as when OBD sampling jitter is high, wireless latency introduces drift, an out-of-phase event is detected, or ripple analysis is being performed, the system suitably invokes a refinement routine that performs warping-based temporal alignment within the bounded window. In that refinement routine, the system suitably computes a monotonic warping path subject to constraints that preserve physical plausibility, thereby better aligning waveform features between the battery-terminal reference sequence and one or more ECU voltage sequences. The refinement routine is suitably selective and event-driven, so that it is invoked only when alignment quality is insufficient for accurate classification.

Event detection is performed over the aligned tuples. For each ECU with a reported voltage value, the system suitably computes a deviation between the ECU-reported voltage and the battery-terminal reference, adjusted by an expected offset for that ECU and operating mode. The expected offset reflects that an ECU's internal voltage sensing can differ systematically from battery-terminal voltage due to wiring drops, local grounds, sensing topology, and calibration. The system suitably compares the deviation to an adaptive tolerance derived from the vehicle profile and the present operating context. When the deviation exceeds the tolerance, the system marks a candidate mismatch for that ECU at the corresponding time. The system suitably groups candidate mismatches over time to apply persistence logic, distinguishing sustained mismatches from short-lived excursions. For example, a deviation that persists beyond a defined persistence interval is treated as a mismatch event, while shorter excursions are treated as transient events, and repeated transients are tracked for intermittent-fault inference. In parallel, the system suitably detects transients by slope analysis on the battery-terminal voltage and on one or more ECU voltages to capture rapid drops associated with cranking or sudden load changes.

After events are detected, the system suitably classifies likely root causes using cross-ECU behavior and battery behavior within the event interval. The classification logic distinguishes system-wide power problems from localized distribution problems. If battery voltage is low or unstable during an event and a large fraction of monitored ECUs concurrently exhibit low voltage behavior, the system suitably classifies the event as a system-wide power issue. Within system-wide issues, the system suitably distinguishes alternator or charging faults from battery or main-feed faults by analyzing ripple indicators, charging stability, and operating mode context. If battery voltage remains stable while only a subset of ECUs exhibit low voltage behavior, the system suitably classifies the issue as localized. The system then uses ECU group mappings to determine whether the affected ECUs share a power feed group or a ground group. Shared group membership supports an inference that a power distribution path or ground path shared by the group is contributing to the observed drop. If the affected ECUs share neither a power group nor a ground group, the system suitably classifies the issue as local to a connector, harness segment, or module. The system suitably assigns a confidence score based on magnitude, persistence, repeatability, the number of ECUs affected, and the consistency of the evidence across operating contexts.

The system suitably generates wiring overlays by mapping classified events to a simplified functional wiring view. For an event affecting a set of ECUs, the system identifies the most likely functional paths connecting the battery or alternator to the affected power feed group, and connecting the affected ECUs to the relevant ground group, and it highlights those paths using color indicators and severity cues. Because the diagrams are functional rather than wire-by-wire, the overlay highlights the relevant distribution areas, such as a junction block, fuse group, ground point grouping, or main feed segment, rather than requiring precise physical routing. This approach supports rapid technician understanding while remaining data-source agnostic.

Finally, the system suitably constructs a diagnostic report. The report includes vehicle identification, a summary of detected events, affected systems and ECUs, evidence excerpts showing battery-terminal voltage and ECU-reported voltage over the event interval, and recommended actions based on the classified fault type. For alternator or charging faults, the report suitably recommends evaluation of alternator output and ripple behavior, charging wiring, and associated connectors. For battery faults or main feed issues, the report suitably recommends battery load assessment and inspection of terminals and main feeds. For power-feed and ground-path faults, the report suitably recommends inspection of the shared distribution points, grounds, straps, and connector corrosion for the affected group. The report suitably references the wiring overlays and provides a clear visualization so that the user can quickly locate the implicated functional areas.

In this manner, the pseudocode corresponds to a workflow that combines independent battery-terminal voltage measurement with ECU-reported voltage information, correlates the data streams in time, detects and characterizes mismatches and transients with persistence logic, classifies likely root causes by analyzing system-wide versus localized behavior and shared power or ground relationships, and produces actionable visualizations and reports without requiring proprietary wire-by-wire OEM schematics.

In some embodiments, the portable computing device autonomously performs correlation and diagnostic evaluation of voltage data obtained from the vehicle and the battery measurement device. The system evaluates whether temporal alignment between battery-terminal voltage measurements and control-module-reported supply voltage parameters satisfies an alignment criterion. When the alignment criterion is not satisfied, the system automatically applies an alignment process, such as a dynamic time warping technique, to generate temporally aligned voltage data pairs for further analysis. The system may also compare supply voltage parameters reported by multiple electronic control modules relative to the battery-terminal voltage measurements and automatically identify a subset of control modules exhibiting correlated voltage deviations. Such correlated behavior can indicate that the affected control modules share a common electrical supply path. In some embodiments, the system further evaluates the correlated voltage behavior using stored electrical distribution relationship information associated with the vehicle, such as information describing power feeds, connectors, fuses, relays, or grounding relationships supplying particular control modules. Using this information, the system can determine one or more suspected electrical distribution elements located between the vehicle battery and an affected control module that may contribute to the observed voltage deviation.

FIG. 4 illustrates an example graphical user interface presented on a portable computing device, such as a smartphone, for displaying diagnostic results generated by the vehicle power supply diagnostic system. The figure shows a first display state and a second display state, which together demonstrate how summary diagnostic information and detailed wiring information are presented to a user.

As shown, a smartphone 400 includes a display screen 402 on which a diagnostic report summary interface 404 is rendered. The diagnostic report summary interface presents vehicle identification information 408, including vehicle model and engine configuration, along with a detected issue indicator 412 identifying an electrical fault condition. In the illustrated example, the detected issue corresponds to a system voltage condition associated with an engine control module.

Diagnostic report summary interface 404 further includes a live data section 416 displaying real-time or near-real-time electrical parameters. The live data section lists multiple voltage values, including a battery voltage value, an alternator output voltage value, and an ignition or control-module-related voltage value, together with corresponding normal operating ranges. Visual indicators, such as icons or highlighting, are used to indicate whether each displayed value is within or outside an expected range.

The diagnostic report summary interface 404 also includes a wiring diagram view control 420, which identifies a highlighted area of interest within the vehicle's electrical system. In the illustrated example, the highlighted area corresponds to an ECM power line. The interface can further display a status message indicating whether voltage is detected on the highlighted path and can provide suggested inspection actions, such as checking a fuse, connector, or ground point. Arrow 410 illustrates a user interaction or navigation action in which selection of the wiring diagram view control 420 causes the display to transition from the summary interface to a detailed wiring diagram display 424.

A wiring diagram 428 depicts a schematic representation of a portion of the vehicle's electrical system associated with a detected issue. The wiring diagram includes representations of electrical components relevant to an electrical issue, such as a fuse, connector, control module, and ground point, interconnected by wiring segments. Selected wiring paths or components can be visually emphasized to indicate a suspected power feed or distribution path associated with the detected voltage anomaly.

In the illustrated example, wiring diagram 428 illustrates both the electrical topology of the relevant power and ground paths and the diagnostic conclusion produced by the system: a sustained voltage drop on a shared or common power feed supplying the ECM, with the most likely fault locations being fuse F12, connector 508, or wiring segment 432 between the battery 500 and the ECM 510, rather than the battery or the ECM itself.

FIG. 5 illustrates an example table of ECU-reported voltage parameters that can be obtained through a diagnostic interface and evaluated by the system. The table identifies representative voltage parameters, example diagnostic sources or parameter identifiers, the type of result returned, and the diagnostic significance of each parameter.

As shown in the table, a first voltage parameter is Control Module Voltage, which is available under standardized OBD-II protocols using PID $42. This parameter returns a single voltage value that represents the supply voltage observed internally by a reporting control module or gateway module. The reported value reflects the voltage available after upstream electrical elements such as wiring, fuses, and connectors. While this parameter can indicate that a control module is experiencing a low-voltage condition, it does not identify the location or cause of the voltage reduction.

The table further lists ECM supply voltage, which can be obtained using an OEM-specific diagnostic parameter. This parameter returns a voltage value specific to the ECM power input and indicates the voltage available to engine-related control functions. Comparison of the ECM supply voltage with battery-terminal voltage or with voltages reported by other control modules allows the system to determine whether a voltage drop is localized to engine-related power feeds or is part of a broader distribution issue.

Similarly, the table includes TCM supply voltage, obtained through an OEM-specific parameter associated with the transmission controller. The voltage value returned reflects the electrical supply available to the TCM. Evaluating this value in conjunction with other ECU-reported voltages allows the system to distinguish between power feed issues that affect multiple modules and issues that are isolated to a particular subsystem.

The table also identifies BCM supply voltage, which reflects the voltage supplied to body-related electronics such as lighting, locking, and interior systems. Because body control modules are often powered through different distribution paths than powertrain modules, the BCM supply voltage is useful for distinguishing cabin-side power distribution issues from engine-bay or powertrain-related issues.

In addition, the table lists ABS or brake control module voltage, which can be obtained through an OEM-specific parameter associated with a braking or stability control module. This voltage value represents the electrical supply available to safety-critical control systems. Deviations in this value may indicate significant power or ground integrity issues that can affect vehicle safety functions.

Finally, the table includes network-aggregated module voltage, which can be reported by an OEM-specific gateway or network controller. This parameter provides an aggregated or representative voltage value for multiple modules on a vehicle network and can be used when individual module-specific voltage parameters are unavailable. While less granular than per-module values, this aggregated voltage can still provide useful context for determining whether a voltage condition is system-wide or localized.

Together, the parameters shown in FIG. 5 illustrate that diagnostic voltage information available through OBD-II and enhanced diagnostic interfaces is generally ECU-local in nature and reflects voltage conditions experienced at specific control modules rather than at the battery terminals. The system uses this ECU-reported voltage information, alone or in combination, as one input to identify electrical anomalies and to correlate those anomalies with independent battery-terminal voltage measurements and temporal behavior in order to diagnose power distribution issues within the vehicle.

FIG. 6 illustrates an example table identifying manufacturer-specific ECU voltage parameters that can be obtained through enhanced diagnostic access beyond standardized OBD-II. The table organizes representative vehicle manufacturers or platforms, the types of voltage parameters commonly exposed by those platforms, the diagnostic access methods used to retrieve the parameters, the typical meaning of the reported voltage values, and the relevance of those values to electrical fault tracing.

As shown for General Motors (GM) platforms, enhanced diagnostic access can expose supply voltage parameters for multiple control modules, including ECM, BCM, transmission control modules TCM, and brake or ABS modules. These parameters are typically accessed using manufacturer-specific diagnostic services, such as UDS ReadDataByIdentifier on newer platforms. The reported voltage values reflect internal or input supply voltage observed at each ECU and enable identification of voltage drops affecting shared or individual power feeds downstream of the battery.

For Ford platforms, enhanced diagnostic parameters similarly expose supply voltage values for modules such as the powertrain control module (PCM), BCM, and ABS module. These values are obtained using UDS-based or Ford-specific diagnostic identifiers and represent voltage present at the module power input or internal supply rail. Comparing these values across modules allows detection of issues such as ground splice faults, connector degradation, or localized power distribution anomalies.

For Stellantis platforms, including Chrysler, Jeep, and RAM vehicles, enhanced diagnostics can expose voltage parameters associated with centralized power distribution components, such as a totally integrated power module (TIPM), as well as supply voltage values for the BCM and PCM. The reported voltages indicate electrical power delivered through integrated distribution elements and are useful for isolating faults within centralized power distribution modules or related wiring paths.

For Toyota and Lexus platforms, enhanced diagnostic parameters can include battery (BATT) voltage, ignition-switched (IG) voltage, and ECU supply voltage values. These parameters differentiate between constant battery feeds and ignition-controlled feeds supplying control modules. This distinction allows separation of ignition-path issues from battery-path issues and supports identification of faults that occur only under specific vehicle power states.

For Volkswagen Group platforms, including VW, Audi, and Porsche vehicles, enhanced diagnostics commonly expose voltage values associated with standardized power terminals, such as Terminal 30 (battery) and Terminal 15 (ignition), as well as internal ECU supply voltage. These parameters are typically accessed using UDS ReadDataByIdentifier services and provide granular voltage context for comparative, multi-ECU analysis across different power and ignition domains.

For BMW platforms, proprietary diagnostic layers built on top of UDS can expose ECU supply voltage, wake-up voltage, and network-related voltage states. These parameters reflect voltage present during different vehicle power states and support time-based correlation of voltage behavior as the vehicle transitions between sleep, wake, and run conditions.

For Mercedes-Benz platforms, proprietary diagnostic parameters can provide ECU supply voltage values that vary according to power state, such as wake, run, or sleep. These values represent voltage observed at the control modules during different operating conditions and enable differentiation between transient voltage anomalies associated with state transitions and sustained voltage reductions indicative of distribution faults.

Together, the table shown in FIG. 6 demonstrates that, while standardized OBD-II provides only limited voltage visibility, many manufacturers expose additional ECU-local voltage parameters through enhanced diagnostic interfaces. These manufacturer-specific parameters reflect voltage conditions experienced at individual control modules or power terminals and can be used by the system, when available, to perform comparative and temporal analysis. The system leverages such parameters in combination with independent battery-terminal voltage measurements to identify whether observed voltage anomalies originate from the battery, the charging system, or downstream power distribution elements.

FIGS. 7-12 collectively illustrate example data representations and analytical frameworks used by the system to evaluate vehicle electrical conditions and to derive diagnostic conclusions. Together, these figures show how ECU-reported voltage information, battery-terminal voltage measurements, vehicle operating state data, and persistence-based evaluation logic are organized, correlated, and interpreted. The figures further demonstrate how voltage patterns observed across one or more control modules and over time are mapped to likely fault categories, and how processing functions can be distributed between local devices and remote computing resources. In combination, FIGS. 7-12 provide context for understanding how raw voltage measurements and related diagnostic information are transformed into actionable electrical power distribution insights.

FIG. 7 illustrates an example table of ECU-reported voltage data evaluated by the system in conjunction with a battery-terminal voltage reference. The table lists representative electronic control units, the functional role of each control unit, the voltage reported by each control unit, the battery-terminal voltage measured during the same evaluation interval, and a derived voltage status.

As shown, ECU-reported voltages can differ from the battery-terminal voltage even when the battery voltage is within a normal operating range. In the illustrated example, two control units report supply voltages that are lower than the battery reference, while a third control unit reports a voltage that substantially matches the battery voltage. The system uses this comparative information to determine whether a voltage anomaly affects multiple control units sharing a common power distribution path or is limited to a specific module.

The voltage status column reflects the system's classification of each ECU-reported voltage relative to the battery reference and expected operating behavior. This classification enables rapid identification of control units experiencing reduced supply voltage and supports downstream fault inference.

FIG. 8 illustrates an example table correlating vehicle operating states with typical battery voltage values and expected ECU voltage behavior. The operating states shown include engine off, engine cranking, engine running, and high electrical load conditions. The table reflects that different operating states have different expected voltage characteristics. For example, transient voltage drops are expected during engine cranking, while ECU-reported voltages should generally track battery voltage during normal engine-running conditions. By associating observed voltage behavior with the current operating state, the system can distinguish between normal, expected voltage variations and anomalous voltage conditions that warrant further analysis.

This operating-state context allows the system to avoid misclassifying normal transient events as faults and to focus diagnostic attention on sustained deviations that occur outside expected operating behavior.

FIG. 9 illustrates an example table mapping observed voltage patterns to likely diagnostic interpretations. The table relates battery voltage conditions, ECU voltage patterns, and inferred causes. As shown, when battery voltage is stable and multiple ECUs report reduced voltage, the system interprets the condition as indicative of a shared power distribution issue. When both battery voltage and ECU-reported voltages are low, the system infers a battery or charging system issue. When battery voltage is stable and only a single ECU reports reduced voltage, the system interprets the condition as a localized wiring or ground fault affecting that control unit.

This pattern-based interpretation allows the system to move beyond simple threshold detection and to infer likely fault categories based on comparative behavior across control modules and the battery reference.

FIG. 10 illustrates an example table identifying the data sources used by the system and the origin of each data type. The table shows that battery-terminal voltage is obtained from a voltmeter coupled to the battery terminals, while ECU-reported voltage, diagnostic trouble codes, and operating-state parameters are obtained through an OBD-II dongle communicating with vehicle control modules.

The table further indicates that correlation results and higher-level diagnostic conclusions can be produced by a remote processing component, such as a cloud server. This separation of data sources highlights that the system integrates measurements from physically distinct locations and devices in order to perform comparative and temporal analysis that is not available from any single data source alone.

FIG. 11 illustrates an example table of processing functions performed by a cloud server or remote computing component of the system. The listed functions include data aggregation, time alignment, voltage correlation, fault inference, and report generation. As shown, some functions can be performed by a local device, such as a smartphone, while other functions are performed by the cloud server. In particular, computationally intensive tasks such as multi-stream correlation and fault inference can be centralized in the cloud server, allowing consistent application of diagnostic logic across different vehicles and diagnostic sessions. Thus, this table illustrates that the system architecture supports distributed processing while maintaining a centralized analytical framework for electrical diagnostics.

FIG. 12 illustrates an example table describing persistence-based evaluation logic used by the system to distinguish transient electrical events from sustained fault conditions. The table relates observed voltage conditions to corresponding evaluation approaches. As shown, transient voltage dips are logged but not flagged as faults, while sustained voltage mismatches persisting beyond a defined evaluation interval are flagged as fault candidates. Repeating intermittent voltage drops increase diagnostic confidence by demonstrating a recurring pattern rather than an isolated event.

This persistence-based logic ensures that diagnostic conclusions are based on sustained and meaningful voltage behavior rather than on momentary fluctuations, thereby improving accuracy and reducing false positives.

The particulars shown herein are by way of example only for purposes of illustrative discussion, and are not presented in the cause of providing what is believed to be most useful and readily understood description of the principles and conceptual aspects of the various embodiments of the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A non-transitory computer-readable medium storing instructions that, when executed by a processor of a portable computing device, cause the portable computing device to perform operations for diagnosing electrical power distribution conditions in a vehicle, the operations comprising:
- establishing a first communication session with a vehicle on-board diagnostic interface;
- establishing a second communication session with a voltage measurement device in electrical communication with terminals of a vehicle battery;
- receiving diagnostic data from the vehicle diagnostic interface, the diagnostic data including at least one control-module-reported supply voltage parameter reported by an electronic control unit of the vehicle;
- receiving battery-terminal voltage measurements from the voltage measurement device, the battery-terminal voltage measurements representing a voltage measured across the vehicle battery terminals and not voltage values reported by the electronic control units;
- temporally correlating the control-module-reported supply voltage parameter with the battery-terminal voltage measurements; and
- determining, based on the correlated data, whether a detected voltage anomaly originates at the battery or along a downstream power distribution path supplying one or more electronic control units.

2. The non-transitory computer-readable medium of claim 1, wherein the instructions further cause the processor, in response to detection of a voltage anomaly based on the correlated data, to autonomously determine whether temporal alignment between the battery-terminal voltage measurements and the control-module-reported supply voltage parameters satisfies an alignment criterion and, when the alignment criterion is not satisfied, autonomously apply a dynamic time-warping alignment process to generate temporally aligned voltage data pairs for comparative analysis.

3. The non-transitory computer-readable medium of claim 1, wherein the instructions further cause the processor to, in response to detection of a voltage anomaly based on the correlated data, autonomously compare supply voltage parameters reported by a plurality of electronic control modules relative to the battery-terminal voltage measurements and autonomously identify a subset of the electronic control modules exhibiting correlated voltage deviations indicative of a shared electrical power distribution path.

4. The non-transitory computer-readable medium of claim 1, wherein the instructions further cause the processor to, in response to detection of a voltage anomaly based on the correlated data, autonomously determine, based on correlated voltage deviations between the battery-terminal voltage measurements and the control-module-reported supply voltage parameters and based on stored electrical distribution relationship information associated with the vehicle, a suspected electrical distribution element positioned between the vehicle battery and at least one affected electronic control module.

5. The non-transitory computer-readable medium of claim 1, wherein the instructions cause the portable computing device to maintain the first and second communication sessions concurrently using at least one wireless communication protocol and to manage asynchronous data reception from the on-board diagnostic interface device and the voltage measurement device.

6. The non-transitory computer-readable medium of claim 1, wherein the instructions further cause the portable computing device to buffer received diagnostic data and battery-terminal voltage measurements with timing information and to apply persistence logic over an evaluation window to distinguish transient voltage events from sustained voltage deviations indicative of a fault condition.

7. The non-transitory computer-readable medium of claim 6, wherein the instructions further cause the portable computing device to evaluate a temporal alignment quality representing whether the diagnostic data and battery-terminal voltage measurements correspond to substantially the same point in time, and, in response to the alignment quality failing to satisfy a defined criterion, to invoke a dynamic time warping process to align the diagnostic data and the battery-terminal voltage measurements prior to comparative analysis.

8. The non-transitory computer-readable medium of claim 1, wherein the instructions further cause the portable computing device to generate a diagnostic output comprising a graphical wiring representation that highlights at least one suspected power distribution element positioned between the vehicle battery and an affected electronic control unit, the suspected power distribution element being identified based on the correlated voltage measurements and comparative analysis.

9. An apparatus for diagnosing electrical power distribution conditions in a vehicle comprising:

a digital computing device including a processor and a memory;

an on-board diagnostic interface device configured for data communication with a vehicle on-board diagnostic interface to receive diagnostic data from one or more electronic control units of the vehicle, the diagnostic data including at least one control-module-reported supply voltage parameter;

a voltage measurement device configured to couple directly to terminals of a vehicle battery and to generate battery-terminal voltage measurements independent of the electronic control units;

wherein the digital computing device is configured to receive diagnostic data from the on-board diagnostic interface device and battery-terminal voltage measurements from the voltage measurement device during overlapping intervals; and wherein the digital computing device is further configured to correlate the at least one control-module-reported supply voltage parameter with the battery-terminal voltage measurements over time to determine whether a voltage anomaly originates at the battery or along a downstream power distribution path supplying one or more electronic control units.

10. The apparatus of claim 9, wherein the on-board diagnostic interface is in communication with a vehicle diagnostic port comprising a diagnostic link connector accessible within the vehicle.

11. The apparatus of claim 10, wherein the digital computing device is further configured to generate a diagnostic output that includes a visual wiring representation highlighting at least one suspected power distribution element positioned between the vehicle battery and an affected electronic control unit, the suspected power distribution element being identified based on the correlated voltage measurements.

12. The apparatus of claim 9, wherein the on-board diagnostic interface is in communication with a vehicle onboard telematics system configured to provide remote access to electronic control units of the vehicle.

13. The apparatus of claim 9, wherein the digital computing device is further configured to maintain simultaneous communication sessions with the on-board diagnostic interface device and the voltage measurement device using at least one wireless communication protocol.

14. The apparatus of claim 9, wherein the digital computing device is further configured to buffer received diagnostic data and battery-terminal voltage measurements with associated timing information and to evaluate the buffered data over an evaluation window to distinguish transient voltage fluctuations from sustained voltage deviations.

15. The apparatus of claim 14, wherein the digital computing device or a remote computing system is configured to evaluate an alignment quality between diagnostic data and battery-terminal voltage measurements and, when the alignment quality fails to satisfy a defined criterion, to apply a dynamic time warping process to generate an alignment mapping between the diagnostic data and the battery-terminal voltage measurements.

16. The apparatus of claim 9, wherein the digital computing device is further configured to classify a detected voltage anomaly as one of a battery condition, a charging system condition, a shared power distribution condition, or a localized wiring or grounding condition based on comparative behavior of the control-module-reported supply voltage parameter and the battery-terminal voltage measurements over time.

17. The apparatus of claim 9, wherein the diagnostic data includes supply voltage parameters reported by a plurality of electronic control units, and wherein the digital computing device is further configured to compare supply voltage parameters reported by different electronic control units to determine whether the voltage anomaly affects a subset of electronic control units sharing a common power distribution path.

18. The method apparatus of claim 17, further comprising classifying a detected voltage anomaly as one of a battery condition, a charging system condition, a shared power distribution condition, or a localized wiring or grounding condition based on comparative behavior of the control-module-reported supply voltage parameter and the battery-terminal voltage measurements over time.

19. A method for diagnosing electrical power distribution conditions in a vehicle, the method comprising:

receiving, by a digital computing device, diagnostic data from an on-board diagnostic interface device coupled for data communication with a vehicle diagnostic link interface, the diagnostic data including at least one control-module-reported supply voltage parameter reported by an electronic control unit of the vehicle;

receiving, by the digital computing device, battery-terminal voltage measurements from a voltage measurement device electrically coupled to terminals of a vehicle battery, the battery-terminal voltage measurements being independent of the electronic control units, wherein the diagnostic data and the battery-terminal voltage measurements are received concurrently by the digital computing device; and correlating, via the digital computing device, the at least one control-module-reported supply voltage parameter with the battery-terminal voltage measurements over time to determine whether a voltage anomaly originates at the battery or along a downstream power distribution path supplying one or more electronic control units.

20. The method of claim 19, further comprising maintaining simultaneous communication sessions between the digital computing device and the on-board diagnostic interface device and between the digital computing device and the voltage measurement device using at least one wireless communication protocol.

21. The method of claim 19, further comprising buffering the diagnostic data and the battery-terminal voltage measurements with associated timing information and evaluating the buffered data over an evaluation window to distinguish transient voltage fluctuations from sustained voltage deviations.

22. The method of claim 21, further comprising evaluating an alignment quality between the diagnostic data and the battery-terminal voltage measurements and, when the alignment quality fails to satisfy a defined criterion, applying a dynamic time warping process to generate an alignment mapping between the diagnostic data and the battery-terminal voltage measurements.

23. The method of claim 19, wherein the diagnostic data includes supply voltage parameters reported by a plurality of electronic control units, the method further comprising comparing supply voltage parameters reported by different electronic control units to determine whether the voltage anomaly affects a subset of electronic control units sharing a common power distribution path.

* * * * *